US008596120B2

(12) United States Patent
Ludwig

(10) Patent No.: US 8,596,120 B2
(45) Date of Patent: Dec. 3, 2013

(54) ELECTRONIC SENSOR OR SENSOR DEVICE, IN PARTICULAR AN ACCELERATION SENSOR, HAVING A CHIP MODULE MOUNTED IN A SENSOR HOUSING

(75) Inventor: Ronny Ludwig, Bodelshausen (DE)

(73) Assignee: Robert Bosch GmbH, Stuttgart (DE)

( * ) Notice: Subject to any disclaimer, the term of this patent is extended or adjusted under 35 U.S.C. 154(b) by 273 days.

(21) Appl. No.: 12/737,657

(22) PCT Filed: Jun. 9, 2009

(86) PCT No.: PCT/EP2009/057083
§ 371 (c)(1),
(2), (4) Date: Apr. 21, 2011

(87) PCT Pub. No.: WO2010/015444
PCT Pub. Date: Feb. 11, 2010

(65) Prior Publication Data
US 2011/0197673 A1   Aug. 18, 2011

(30) Foreign Application Priority Data

Aug. 6, 2008   (DE) .................. 10 2008 041 035

(51) Int. Cl.
*G01P 1/02*   (2006.01)
(52) U.S. Cl.
USPC .......................................... 73/493; 73/866.5
(58) Field of Classification Search
USPC ........... 73/493, 488, 866.5; 29/883–885, 835, 29/841, 592.1
See application file for complete search history.

(56) References Cited

U.S. PATENT DOCUMENTS

| | | | |
|---|---|---|---|
| 4,957,876 A | * | 9/1990 | Shibata et al. ............. 29/827 |
| 6,041,498 A | * | 3/2000 | Hillbish et al. ............ 29/883 |
| 6,739,916 B2 | * | 5/2004 | Geil et al. .................. 439/682 |
| 7,375,406 B2 | * | 5/2008 | Lamb et al. ................ 257/424 |
| 2004/0118227 A1 | * | 6/2004 | Tokunaga et al. ........ 73/866.1 |
| 2007/0139044 A1 | | 6/2007 | Lamb et al. |

FOREIGN PATENT DOCUMENTS

| | | |
|---|---|---|
| CN | 1898534 | 1/2007 |
| CN | 1976128 | 6/2007 |
| DE | 41 42 139 | 6/1993 |
| DE | 42 18 793 | 12/1993 |
| DE | 195 39 584 | 4/1997 |
| DE | 200 03 951 | 7/2001 |
| DE | 10 2006 037 691 | 2/2008 |
| EP | 0 637 081 | 2/1995 |
| FR | 2 748 105 | 10/1997 |

OTHER PUBLICATIONS

Motorola: "Micromachined Accelerometer Motorola MMA1201P" (Online) 2000, pp. 1-8.

* cited by examiner

*Primary Examiner* — Helen Kwok
(74) *Attorney, Agent, or Firm* — Kenyon & Kenyon LLP

(57) ABSTRACT

An electronic sensor has a sensor housing in which a chip module having a module housing is mounted. The module housing has terminal pins that protrude laterally outward, each having a tapering at its free end. In addition, at least one metallic bearer strip is provided that is fashioned, in a first end area, as a plug contact, and that has in a second end area for at least one terminal pin a respective spring-clamp contact point that forms a flexible press-in zone for the corresponding terminal pin.

11 Claims, 10 Drawing Sheets

ELECTRONIC SENSOR OR SENSOR DEVICE, IN PARTICULAR AN ACCELERATION SENSOR, HAVING A CHIP MODULE MOUNTED IN A SENSOR HOUSING

BACKGROUND OF THE INVENTION

1. Field of the Invention

The present invention relates to an electronic sensor or sensor device, in particular an acceleration sensor, having a sensor housing in which a chip module is mounted, the sensor housing having plug contacts that are connected via electrical connections to terminals that are situated on a module housing of the chip module.

2. Description of Related Art

Such a sensor, in which the chip module is mounted immediately in the sensor housing without a substrate or circuit board, is known from published German patent document DE 10 2006 037 691 A1. Here, it is necessary to form press-in zones in the module housing itself and to form corresponding press-in pins on the sensor housing.

However, differing from the named generic prior art, the most widely distributed type of sensor manufacture is the assembly of an SMD-capable module housing (whose design is oriented towards a standard chip housing, e.g. SOP), containing the sensor chip, the ASIC (signal processing chip), and, if warranted, passive components, on a circuit board using standard SMD processes. The equipped circuit board is subsequently mounted, using binding processes or soldering processes or cold contacting technology (press-in technology, insulation-piercing clamps, etc.), in a previously manufactured plastic housing having metallic inserts. Finally, this sensor housing (the final housing of the sensor) is sealed with a roof (glued, laser-welded, etc.) or is cast with a filling material. Such a chip module provided for fastening on a substrate is known for example from DE 10 2004 058 815 A1. In these designs, a circuit board is accordingly required as a bearer of the module housing and of passive components that may be present. Today, this technology and the assembly processes associated therewith have a strong determining effect on the price and marketability of a sensor, with regard also to the forthcoming development/conversion of solder techniques to lead-free solders and the associated development costs.

In the area of the module housing, a large number of housings and "pin shapes" are known. In particular, dual in-line packages (DIP) are known as module housings, though not in their original shape having terminal pins provided for "plug-through assembly" in metallic circuit board bores, but rather having terminals designed for currently standard surface mounting technology (SMD).

BRIEF SUMMARY OF THE INVENTION

With regard to the electrical sensor, the present invention provides that the module housing has terminal pins that protrude laterally outward, each pin tapering at its free end, and in that at least one metallic bearer strip is provided that is fashioned in a first end area as a plug contact and that has in a second end area for at least one terminal pin a respective spring-clamp contact point that forms a flexible press-in zone for the corresponding terminal pin. It is also the case according to the present invention that at least one opening is provided in the bearer strip for each of the terminal pins that are not to be contacted.

Thus, the present invention succeeds in achieving the reliable and mechanical integration of a module housing that can be produced and standardized using standard processes in a plastic housing that can be manufactured to order for the individual customer. According to the present invention, the use of lead in the sensor is not required. The present invention is based on an integrated sensor design based on a minimally modified standard dual in-line package (DIP) with completely integrated switching technology, mounted and further processed on a spring contact bearer using press-in technology. On the basis of this design, the present invention does without a circuit board or a substrate, resulting in a reduction in costs. A further positive effect on costs is achieved by the fact that according to the present invention no modification of the matrix of known DIP lead frames is required, so that production is possible using standard machines and tools. Due to the only slight modifications made to the pins of the DIP, measurement or compensation using standard measurement measures is enabled, so that no expensive special designs are required.

In addition, a particular advantage results from the variability provided by the present invention with regard to those terminal pins for which contacting is desired. For this purpose, only those pins are pressed in that are necessary for electrical functioning and mechanical stability. For all other terminal pins, corresponding openings are provided in the bearer strip.

According to an example embodiment of the present invention that is regarded as particularly advantageous, in order to form the press-in zones the bearer strip is stamped down in the second end area to a smaller thickness than in the first end area, and the press-in zones each have a slot situated transverse to the longitudinal direction of the bearer strip in order to accept the corresponding terminal pin, as well as two cross-struts, the cross-struts each being adjacent to one of the oppositely situated sides of the slot on the one hand and to a respective opening in the bearer strip on the other hand. Thus, the required flexibility of the press-in zones can be realized through simple stamping measures.

According to an advantageous development, the bearer strip can be designed, through the choice of its material, its thickness, and the situation and size of the slot and of the openings, in such a way that a spring action of the cross-struts is provided during the pressing in of the terminal pins.

As a module housing, a low-cost standard chip housing, in particular a dual in-line housing (DIP), can advantageously be used as long as it has terminal pins that are capable of plug-in assembly, or as long as such pins are produced, for example by straightening SMD-capable bent pins.

A method according to the present invention for producing a sensor or sensor device provides that the module housing is mounted on the metallic bearer strip or strips using press-in technique, and that the module housing and the bearer strip are subsequently embedded in a sensor housing by molding around them together with plastic.

DETAILED DESCRIPTION OF THE INVENTION

Figure 1A:
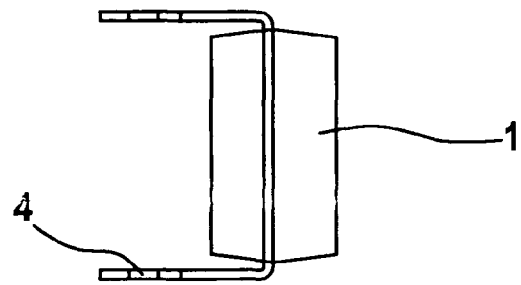
FIGS. 1A, 1B and 1C show different views of a DIP module housing having terminal pins modified according to the present invention.
Figure 1B:
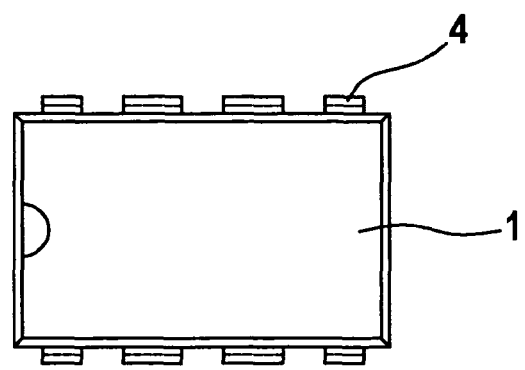
Figure 1C:
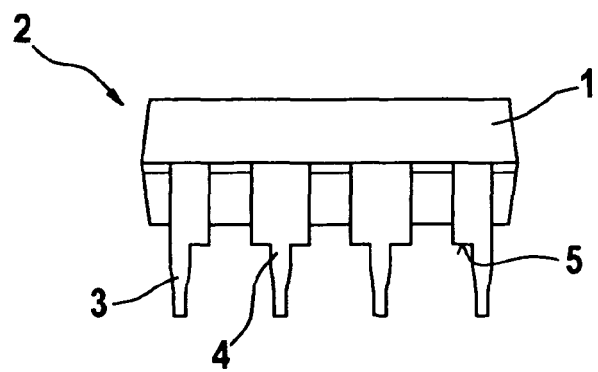

FIGS. 1A, 1B and 1C show, from the front (FIG. 1A), in a top view (FIG. 1B), and from the side (FIG. 1C), a representation of a dual in-line package (DIP), standardized according to JEDEC, having in each case four pins 4 protruding from the two longitudinal edges. Module housing 1 of chip module 2 is manufactured in a known manner using a transfer molding process (material: an epoxy-based molding compound). Module housing 1 contains, on a structured lead frame (circuit bearer), the microstructured sensor chip, the ASIC, and passive components (none of which are shown). According to the present invention, the only modification is that the shape of terminal pins 4 ("small legs") is slightly modified. The modification includes at least a tapering 3 at the free end of each pin 4. A stop surface 5 is also advantageous. Accordingly, in the depicted exemplary embodiment the basis of chip module 2 is a JEDEC-conformed standard module housing 1 having a dual-in-line design, in which the complete circuit, i.e. the circuit bearer (structured lead frame), sensor chip, ASIC, and passive components that may be present, are integrated. However, terminal pins 4 of this module housing 1 according to the present invention has been made narrower by a tapering 3 of the ends of the pins 4. Moreover, the transition from pin 4 to housing 1 is designed without a phase, differing from the original DIP. Rather, one stop surface 5 is provided per terminal pin 4.

The modification of pins 4 advantageously does not influence the raster dimension in the lead frame composite, in either the x or y direction. Normal separating bending tools may also be used. Thus, representation within known matrix lead frame structures is possible, as well as production on standard machines.

Figure 2:
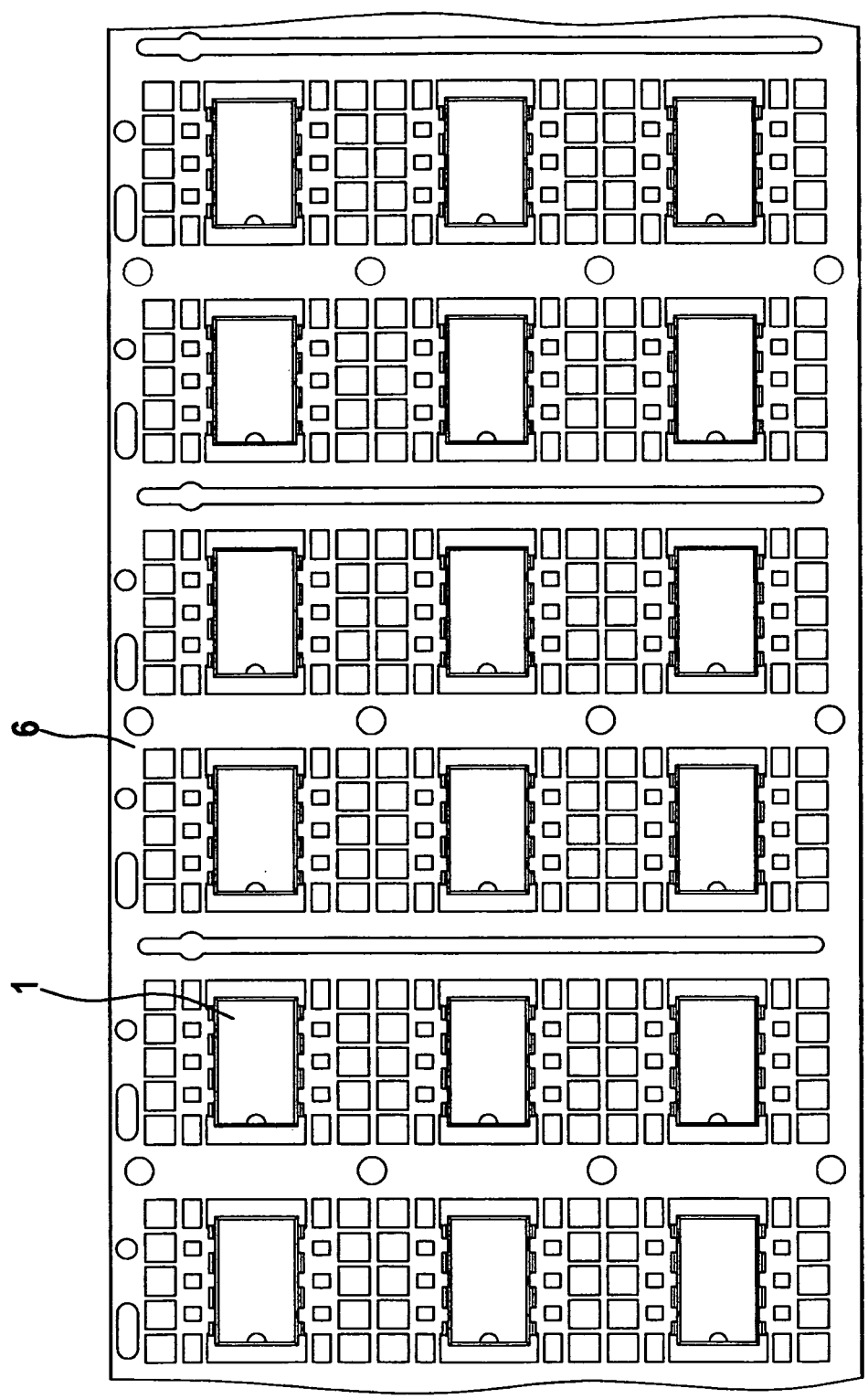
FIG. 2 shows the module housing shown in FIG. 1, in the matrix-lead frame composite design of many module housings.

FIG. 2 shows the representation of the DIP module housing 1 shown in FIG. 1, in a composite of several module housings, in the form of a lead frame 6; more precisely, the Figure shows the excerpt of a matrix lead frame. Because this is very similar to a standard module housing 1, in which only the final shape of "pins" 4 has been slightly modified, manufacture is possible on standard machines using methods that are standardized worldwide, resulting in a significant cost savings, because existing manufacturing lines and existing injection molding and separating bending tools may be used.

Figure 3:
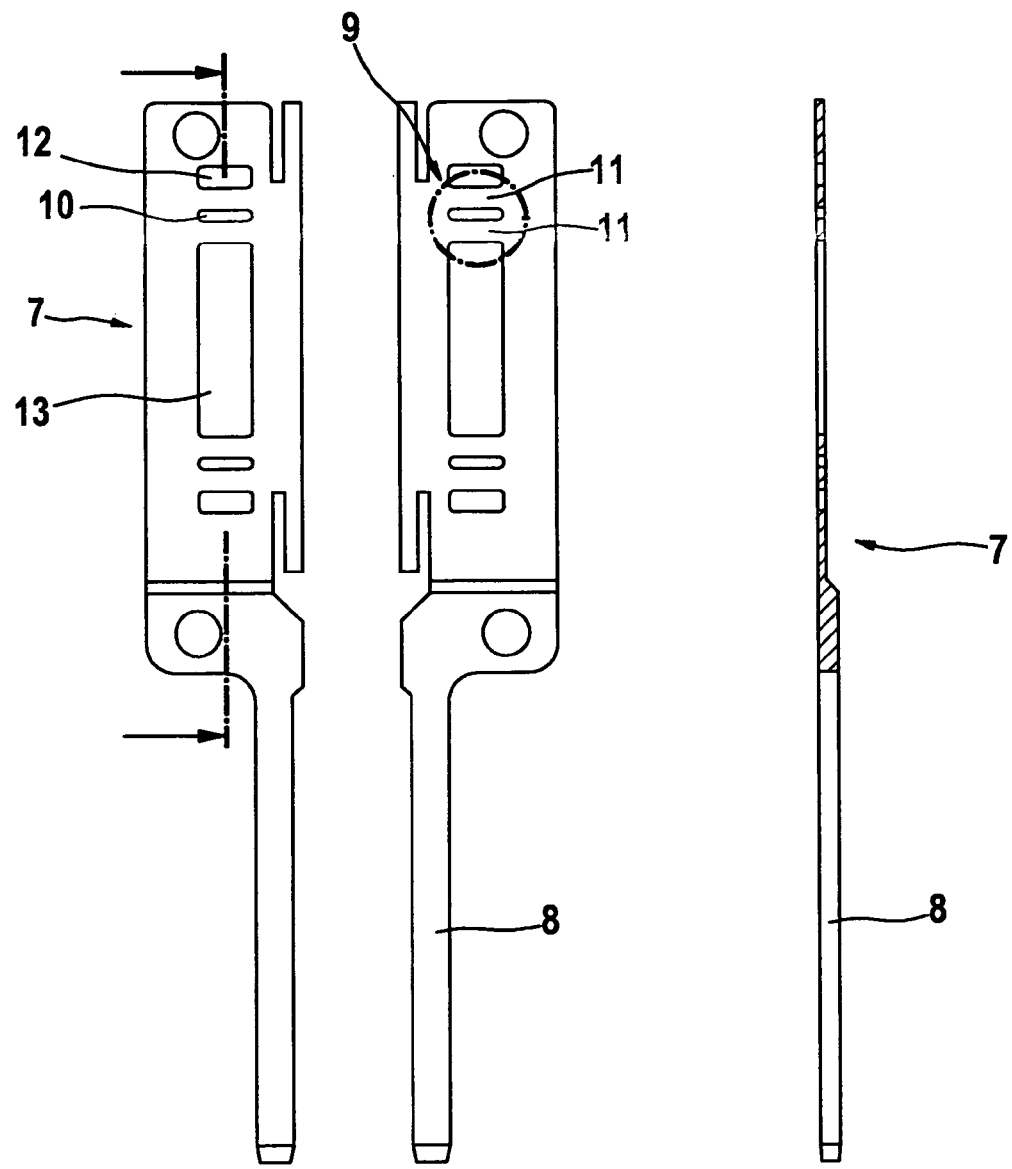
FIG. 3 shows a top view and a transverse view of bearer strips according to the present invention.

FIG. 3 shows a representation of metallic bearer strip 7 according to the present invention, in two views. (In the top view, two bearer strips are shown next one another that are respectively responsible for the electrical and mechanical connection to terminal pins 4 situated on a common side of DIP module housing 1.) The thickness of bearer strip 7 is defined by the desired client interface; in this example, it is 0.6 mm thickness of plug contact 8. Raw band 14, made e.g. of $CuSn_6$ (cf. FIG. 4), is stamped down on one side (here in the left end area of bearer strip 7 shown in FIG. 3) to the thickness required for the contacting to DIP housing 1. The structure of clamp-spring contacts 9 for the later receiving of DIP housing 1 are stamped into stamped-down band 14, and are galvanically coated if warranted.

According to the present invention, metallic bearer strip 7 performs two functions:

On the one hand, it realizes the plug contact interface. On the other hand, it provides the possibility of electrically contacting DIP module housing 1 using press-in technology (cold contacting technology), and of securely fastening said housing mechanically.

The performance of the first function is ensured by corresponding stamping tools and by the suitable choice of the thickness of bearer strip 7. For the second function, spring contact clamp points 9 are provided. In principle, here the standard press-in technique is inverted: the pin is made massive and the press-in area is designed so as to be resilient, or to perform a clamping function. According to the present invention, the pins are the small legs 4 of DIP module housing 1, and press-in areas 9 are represented by a function-oriented design of bearer strip 7. For this purpose, bearer strip 7 is stamped down to the required dimension, and spring-clamp contact points 9 are realized in the required number by stamped-in slots 10. Here, slots 10 are limited by cross-struts 11 that are formed using openings 12 and 13.

Figure 4:
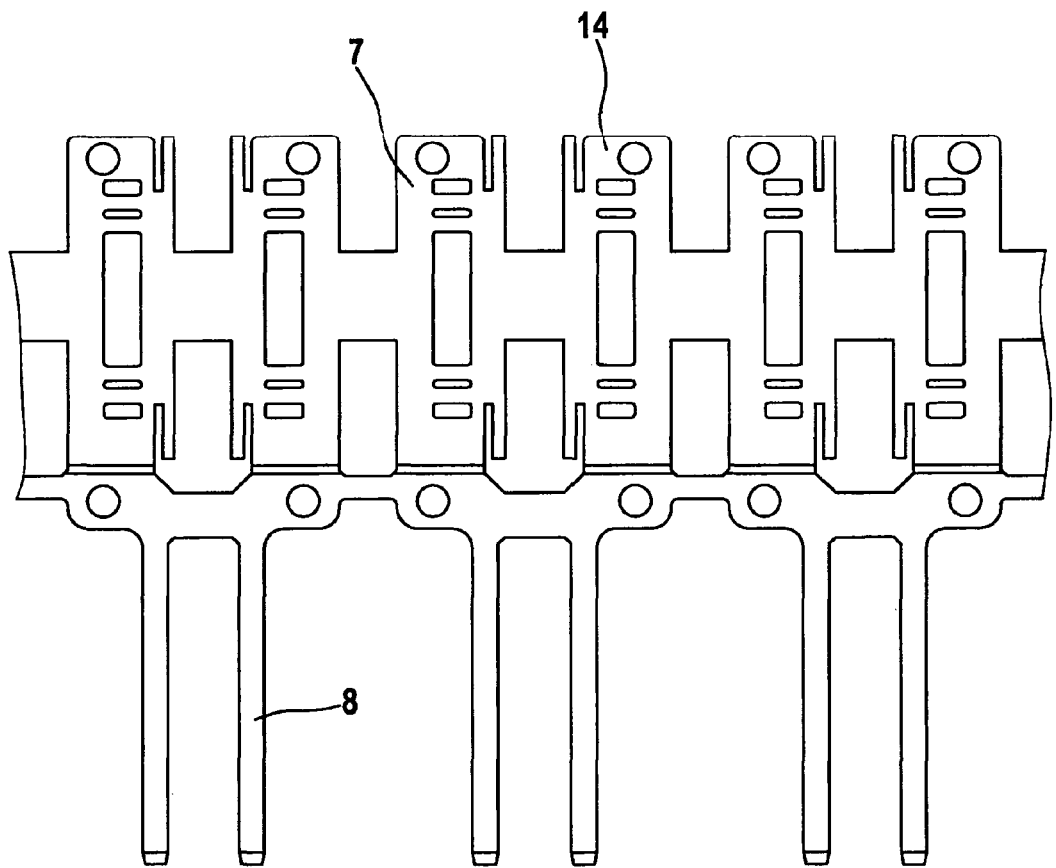
FIG. 4 shows the bearer strips shown in FIG. 3 in the form of a continuous band.

FIG. 4 shows a representation of bearer strip 7 according to the present invention as a composite in a continuous band 14 (only a small segment of band 14 is shown). In the form of a band 14, band galvanic processes are possible, such as those that are also typically provided in the case of press-in contacts. The individuation of bearer elements 7 by a stamping process does not take place until final assembly. Because the stamping process takes place in a band 14, galvanically applied surfaces may also be provided partially on plug pins 8, i.e., differing from the rest of bearer 7, so that the areas of bearer strip 7 can be provided with surfaces fitting their respective functional environments.

Figure 5:
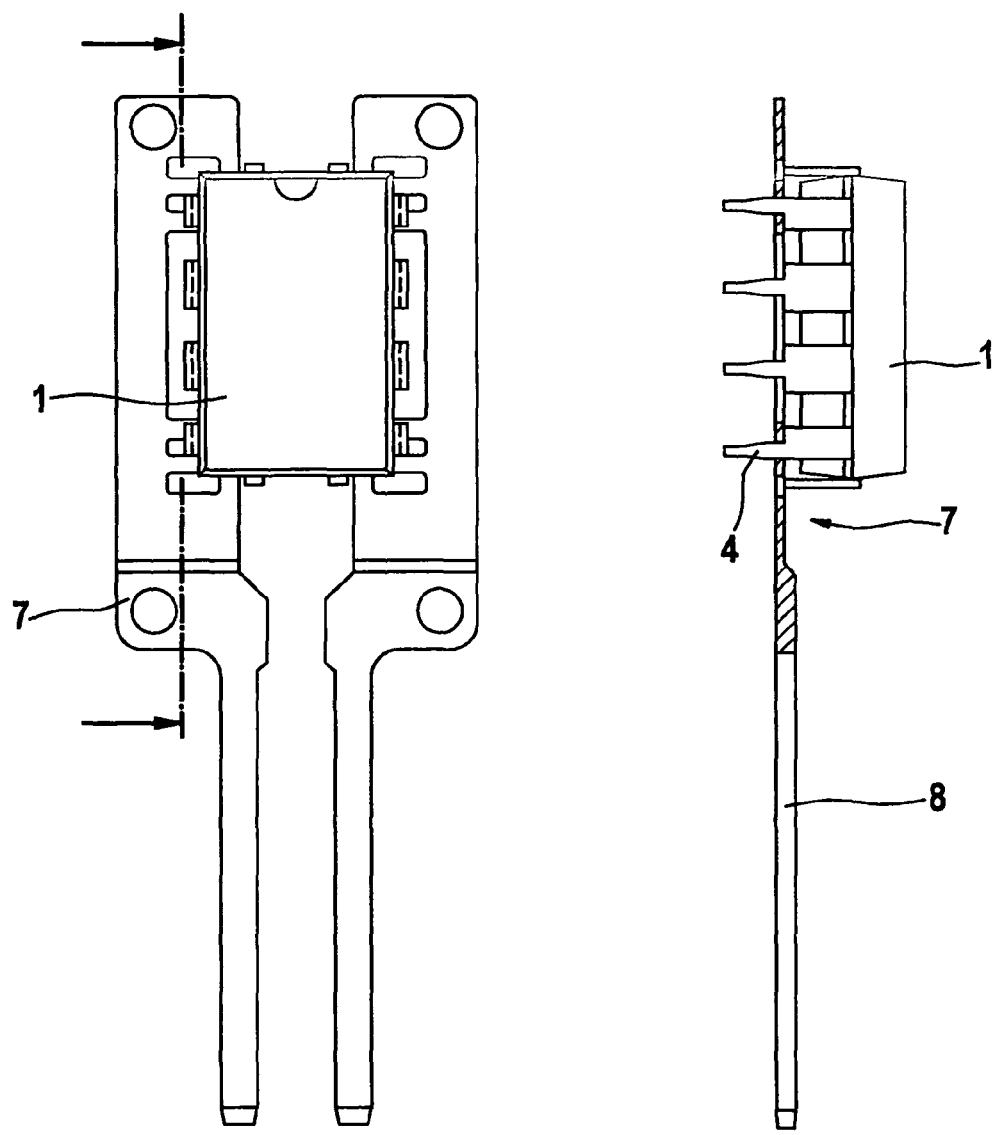
FIG. 5 shows a top view and a cross section of a chip module pressed in onto two bearer strips according to the present invention.

FIG. 5 shows a representation of the design according to the present invention. DIP housing 1 is connected to bearer strip 7 using press-in technology (or cold contacting technology); for the precise sequence, see also the detailed view shown in FIG. 6. Optionally, lateral guides, realized by a bending process, can be provided on bearer strip 7 for the pre-fixing of DIP housing 1. As an example, an eight-pole module housing 1 is shown, so that four terminal pins 4 are allocated to each bearer strip 7. As can be seen, the two center terminal pins 4 of each row of terminals are not contacted in press-in zones 9, but rather extend freely, i.e. without electrical contact, for example through opening 13. The accompanying terminal pins 4 that are not to be contacted during normal operation of the sensor are required only in test operation.

Figure 6:
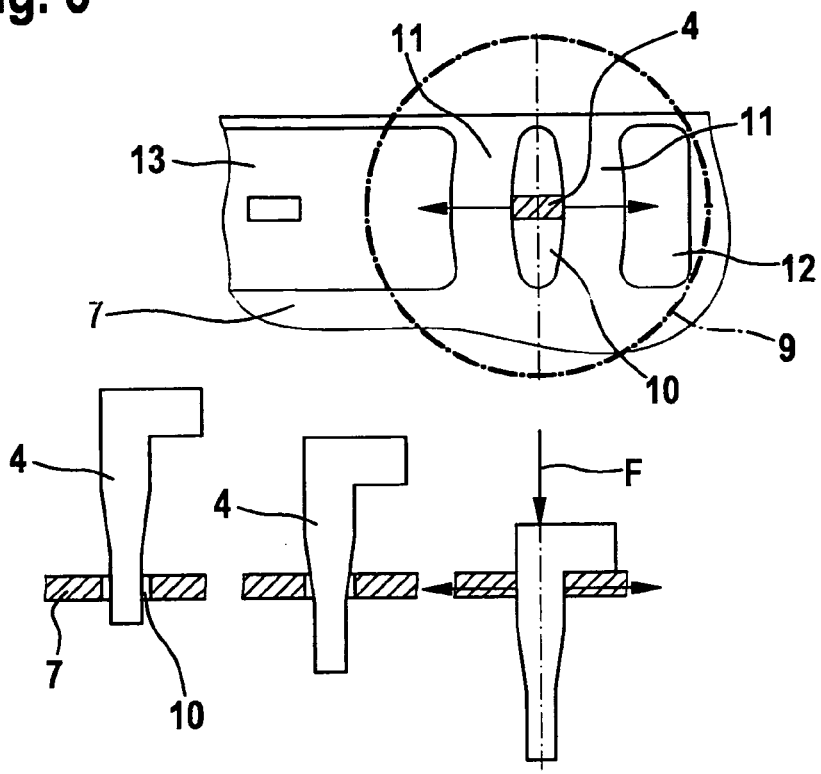
FIG. 6 shows a detailed representation illustrating the press-in zones of the bearer strip and of the press-in process.

In FIG. 6 it can be seen how, in a bearer strip 7 that is correspondingly designed constructively and with regard to its material, a spring-clamp action on pins 4 of DIP housing 4 arises at spring-clamp contact points 9 through the press-in process. First, DIP pin 4 is threaded into a slot 10 of bearer strip 7. As it is further pressed in, DIP pin 4 comes into contact with cross struts 11, and exerts a lateral force on these struts, in response to which the cross-struts can yield flexibly to some extent due to their construction, or due to openings 12 and 13. Finally, the respective terminal pin 4 is completely pressed in, and creates a secure electrical and mechanical connection to bearer strip 7.

During the equipping with components, according to FIGS. 5 and 6 tapered areas 3 of pins 4 are situated in slots 10 provided for this purpose in bearer strip 7, because the dimensions of pins 4 in tapered area 3 are slightly narrower than the width of slots 10. Through application of force, pins 4 are pressed into slots 10. The clamping action is achieved in that pins 4 are broader in the non-tapered area than are slots 10 in bearer 7. Bearer 7 must here permit a certain spring action of cross-struts 11, which is easily possible through a corresponding design on the basis of the available parameters.

Figure 7:
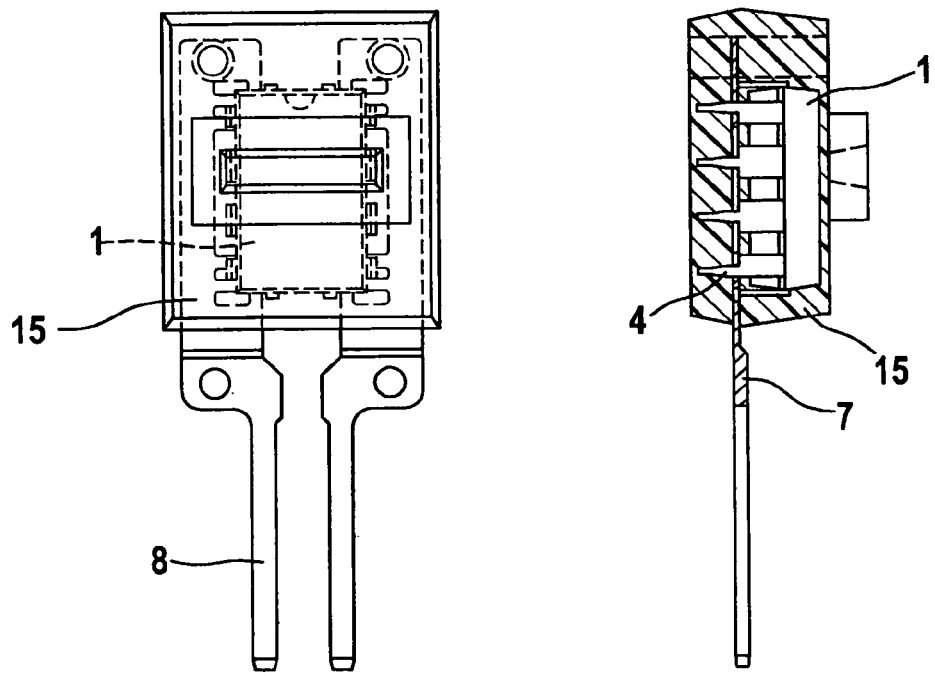
FIG. 7 shows a top view and a cross-section of a system according to FIG. 5, molded around with an intermediate housing.

In order to secure this electromechanical connection, an intermediate housing 15 is molded around bearer strip 7; see FIG. 7. For the mechanical fixing of pressed-in DIP housing 1 on bearer strip 7, and in order to decouple the stress during the subsequent injection-molding process of the surrounding sensor housing (final housing), the design according to FIG. 5 is molded around by a surrounding intermediate housing 15 made for example of a partly flexible material (silicone). In the selected views shown in FIG. 7, the shape given to intermediate housing 15 can be seen; this shape is shown only as an example. The injection-molding tool required for the production of intermediate housing 15 can be used as a basis for the press-in process in that "sliding elements" perform the function of supporting the coupling in of force; see FIG. 10 below. These "sliding elements" in the injection-molding tool can also simultaneously perform the function of the ejection of intermediate housing 15. Moreover, intermediate housing 15 is advantageous with regard to the decoupling of the stress during the molding around (which takes place at very high pressure, >500 bar) by the plastic of the sensor housing.

Finally, bearer strip 7 and intermediate housing 15 are molded around with a plastic in such a way that a final housing (sensor housing) 16 results that contains plug interface 8a (see FIG. 8) and a fastening possibility 17.

Figure 8:
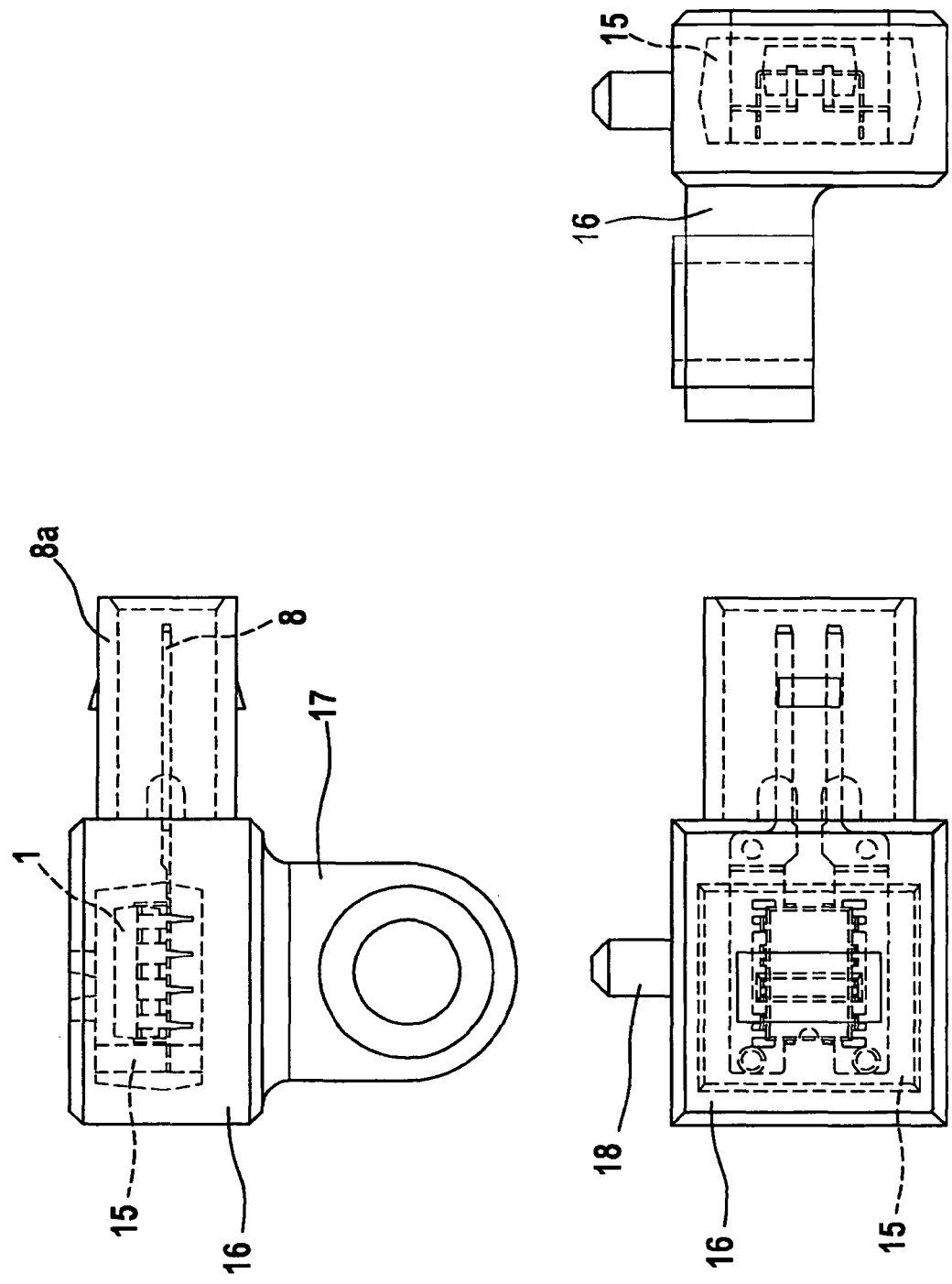
FIG. 8 shows various views of the final sensor housing.

FIG. 8 shows a representation of the final sensor housing 16 having the previously described design, in a plurality of views and in a "through-view." The shape has been chosen as an example and is suitable in particular for an acceleration sensor in a motor vehicle. An assembly pin 18 can also be seen.

Figure 9:
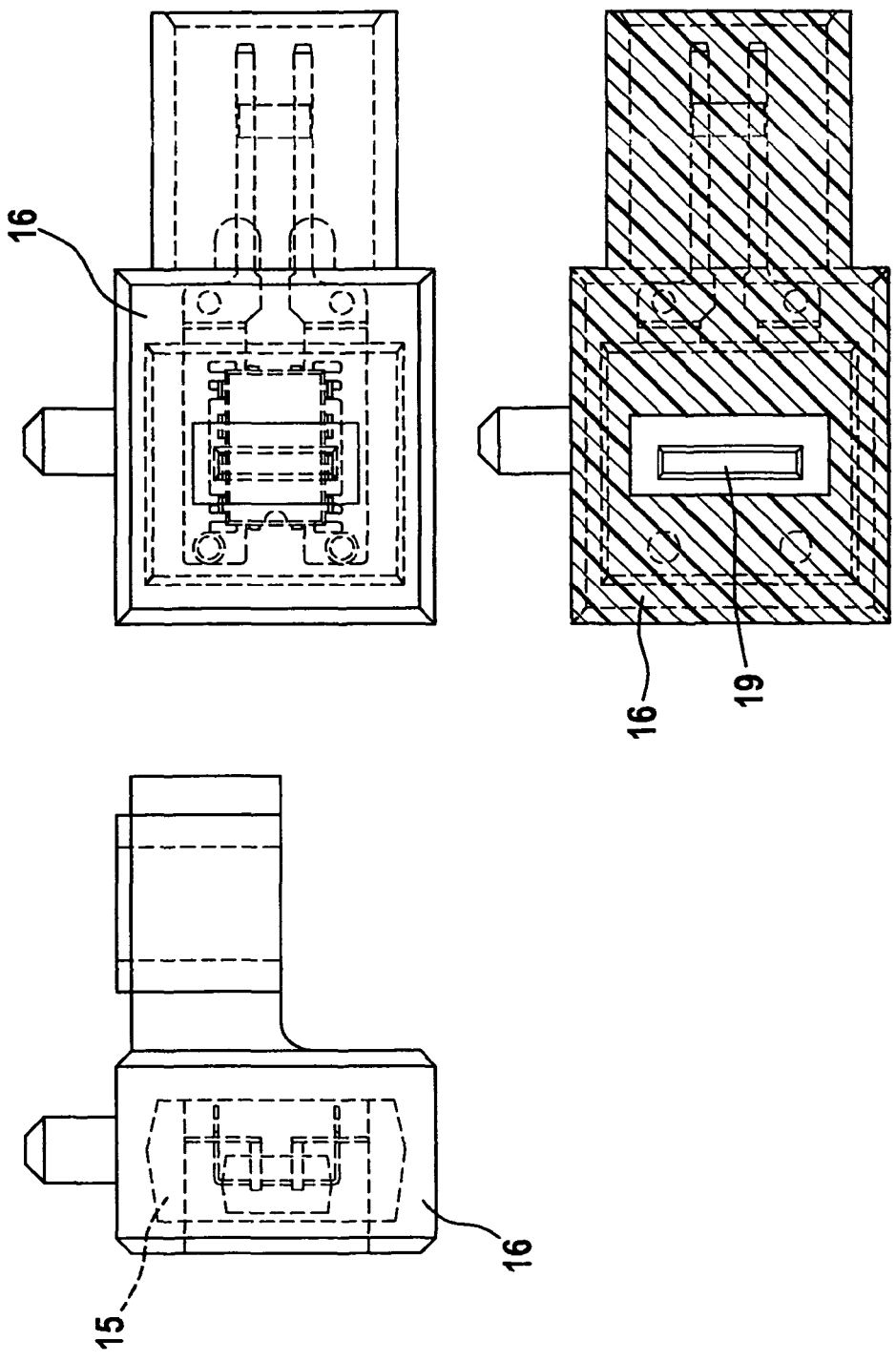
FIG. 9 shows further representations of the final sensor housing.

FIG. 9 shows further views of the final housing 16 of the sensor. In order to permit the fixing of intermediate housing 15 in the injection-molding tool of the final housing 16, in the depicted exemplary embodiment an "attachment having a central recess" 19 is provided on the upper side of intermediate housing 15. The counterpart thereto is situated in the injection-molding tool (not shown), and supports the precise positioning of intermediate housing 15 relative to final housing 16. The injection point of final housing 16 is selected in such a way (e.g. underneath the socket) that the injected plastic mass presses intermediate housing 15 precisely against this receiving surface 19.

Figure 10:
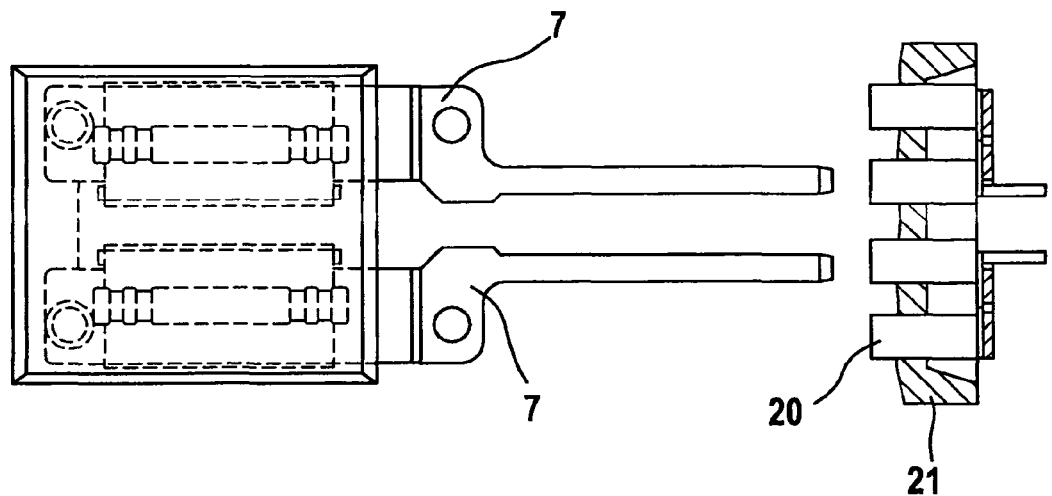
FIGS. 10 through 12 show various stages of the production process according to the present invention of the sensor according to the present invention.
Figure 11:
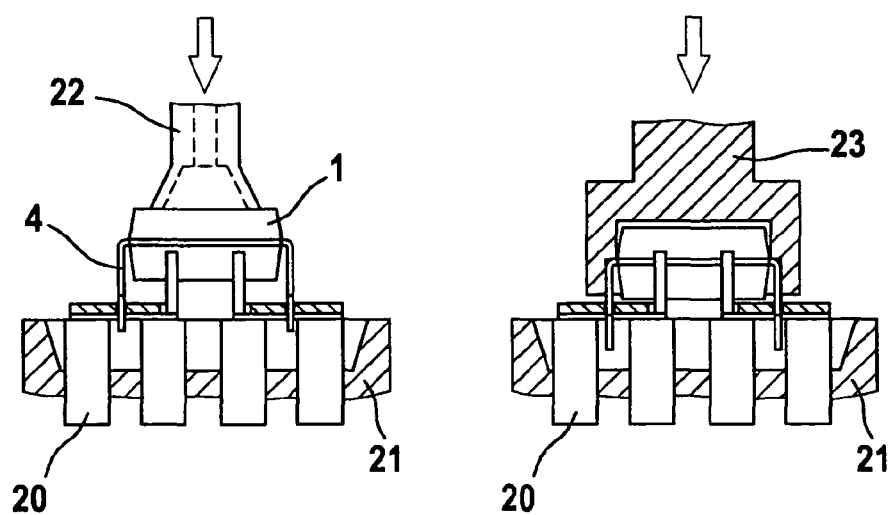
Figure 12:
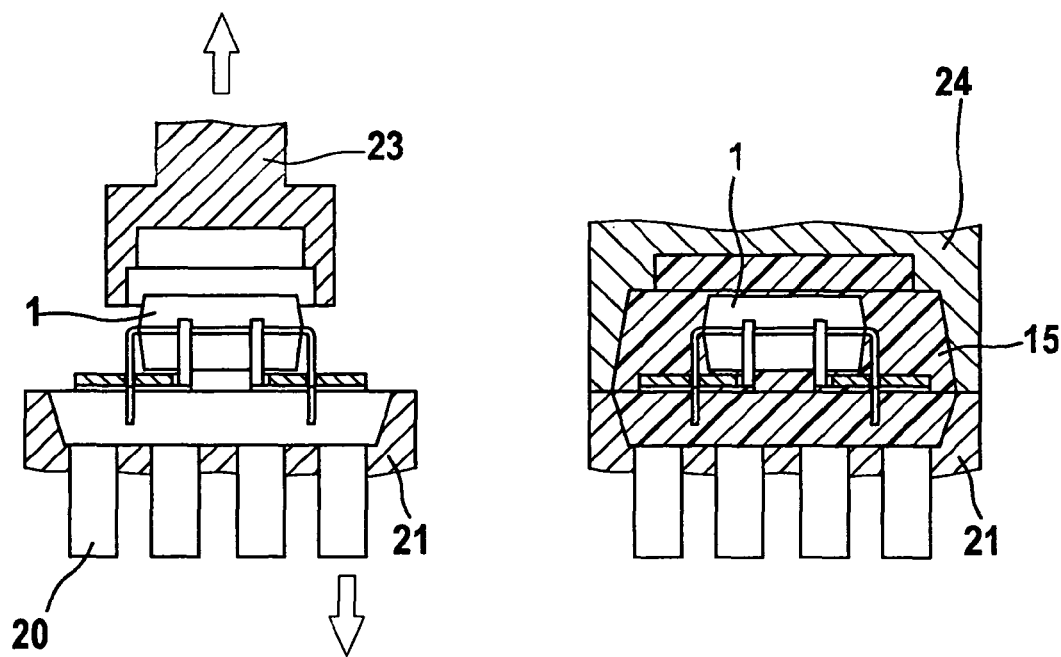

FIGS. 10 through 12 show various stages of a possible process sequence during manufacture.

According to FIG. 10, first bearer elements 7 that have been stamped free are positioned over the lower injection-molding cavity 21 that is provided for the manufacture of intermediate housing 15. In cavity 21 there are situated sliding elements 20 that have been extended to the height of bearer strip 7.

Through a pick and place process, using vacuum suctioning unit 22 DIP housing 1 (see FIG. 11, left part) is positioned relative to bearer strip 7 and is equipped with components (threaded).

A press-in tool 23 (see FIG. 11, right part) presses housing 1 or DIP pins 4 into spring elements 9 of bearer strip 7. During the press-in process, "sliders" 20 in injection-molding tool 21 simultaneously form the "counter-support" for the pressure force applied from above.

Press-in tool 23 and sliders 20 required to accept the force are subsequently retracted (see FIG. 12, left part); upper injection-molding cavity 24 is then sealed by the injection-molding tool provided for the manufacture of intermediate housing 15 (see FIG. 12, right part).

After the injection of the compound and cooling, intermediate housing 15 is finished. Sliders 20 here simultaneously act as "ejectors" of intermediate housing 15 from lower injection-molding cavity 21.

Finally, surrounding final housing 16 is molded around, with the result shown in FIGS. 8 and 9, providing plug interface 8a and screw or assembly possibility 17 and 18.

In conclusion, in the following some essential advantages of the present invention are summarized:

An ideal decoupling of stress between DIP module housing 1 and bearer strip 7 is enabled due to the length of the pins on DIP housing 1. This also results in a very small constructive size of the overall sensor. In particular, the assembly processes are greatly reduced. Because no thermal assembly or connection processes, such as welding, soldering, etc., are required, no thermal stress is placed on the DIP module housing by the connection technology used. Because the possible housing shapes are practically unlimited, in particular sensor housings suitable for use in motor vehicles may also be realized.

In addition, there results a mitigation of the so-called "particle problem" of electrically conductive particles. Contamination by solder balls, flux residue, powder residue during welding, adhesive residue during silver conductive gluing, etc., is not a problem due to the assembly according to the present invention.

Given the use of a transfer molding method (i.e., if final housing 16 is manufactured from a molding compound/epoxy), intermediate housing 15 can be omitted if warranted.

Using one and the same DIP module housing 1, for many types of sensor all the sensing directions can easily be realized merely by varying the position of the bearer strip (0°, 45°, 90° sensors, etc.).

What is claimed is:

1. An electronic acceleration sensor, comprising:
   a chip module having a module housing;
   a sensor housing in which the chip module is mounted, the sensor housing containing at least one plug contact connected by an electrical connection to at least one terminal situated on the module housing of the chip module, wherein the module housing has terminal pins protruding laterally outward, each terminal pin having a tapering at a free end; and
   at least one metallic bearer strip having a first end area configured as the at least one plug contact and a second end area configured as a spring-clamp contact point for at least one terminal pin, wherein the spring-clamp contact point includes a slot in the bearer strip oriented transverse to a non-tapered section of the at least one terminal pin inserted in the slot and bounded by cross-struts that flex to clamp onto the non-tapered section of the at least one terminal pin, and wherein openings are provided in the bearer strip for non-contacting terminal pins.

2. The sensor as recited in claim 1, wherein:
   the bearer strip is stamped down in the second end area to a thickness smaller than in the first end area and has two cross-struts, each cross-strut being adjacent to one of the oppositely situated sides of the slot and to a respective opening in the bearer strip.

3. The sensor as recited in claim 2, wherein material of the bearer strip, thickness of the bearer strip, location of the slot, size of the slot, location of the openings, and size of the openings are selected to provide a spring action of the cross-struts during pressing-in of the at least one terminal pin.

4. The sensor as recited in claim 1, wherein the module housing is a dual-in-line housing having terminal pins capable of plug-in assembly.

5. The sensor as recited in claim 2, wherein the terminal pins each have at least one stop surface between the tapering and a transition to the module housing, the at least one stop surface being seated on the bearer strip when the terminal pin is pressed in.

6. The sensor as recited in claim 2, wherein an intermediate housing mounted in the sensor housing is molded around the second end area of the bearer strip.

7. A method for manufacturing an electronic sensor, comprising:
providing a chip module having a module housing, wherein the module housing has terminal pins protruding laterally outward;
providing a sensor housing;
providing at least one metallic bearer strip having a first end area configured as at least one plug contact and a second end area configured as a spring-clamp contact point for at least one of the terminal pins, wherein the spring-clamp contact point includes a slot in the bearer strip oriented transverse to a non-tapered section of the at least one terminal pin inserted in the slot and bounded by cross-struts that flex to clamp onto the non-tapered section of the at least one terminal pin, and wherein openings are provided in the bearer strip for non-contacting terminal pins;
connecting the module housing onto the metallic bearer strip using press-in technology; and
embedding the module housing and the metallic bearer strip in the sensor housing by molding around the module housing and the metallic bearer strip with plastic.

8. The method as recited in claim 7, wherein a continuous band having a plurality of bearer strips is provided as a composite, and subsequently an individuation of the bearer strips takes place through a stamping process, and thereafter respective assembly of the module housing onto the corresponding bearer strip takes place.

9. The method as recited in claim 7, wherein galvanically applied surfaces are produced on the at least one bearer strip using at least one band galvanic process.

10. The method as recited in claim 9, further comprising:
positioning the at least one bearer strip over a lower injection-molding cavity of an injection-molding tool, wherein sliding elements extending to a height of the bearer strip are provided in the cavity;
positioning and pressing the module housing into the bearer strip using a press-in tool, wherein coupling in of force is supported by the sliding elements;
retracting the press-in tool and the sliding elements;
producing an intermediate housing by the molding around with plastic; and
producing the sensor housing by molding around the intermediate housing and a plug contact of the bearer strip using a further injection mold.

11. The electronic acceleration sensor according to claim 1, wherein the slot is continuously bounded on all sides by the bearer strip.

* * * * *

UNITED STATES PATENT AND TRADEMARK OFFICE
CERTIFICATE OF CORRECTION

PATENT NO. : 8,596,120 B2
APPLICATION NO. : 12/737657
DATED : December 3, 2013
INVENTOR(S) : Ronny Ludwig It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 348 days.

Signed and Sealed this

Twenty-second Day of September, 2015

Michelle K. Lee
*Director of the United States Patent and Trademark Office*